(12) United States Patent
Hertel et al.

(10) Patent No.: US 8,563,407 B2
(45) Date of Patent: Oct. 22, 2013

(54) DUAL SIDED WORKPIECE HANDLING

(75) Inventors: Richard J. Hertel, Boxford, MA (US); Ernest E. Allen, Jr., Rockport, MA (US); Philip J. McGrail, Jr., Northwood, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 631 days.

(21) Appl. No.: 12/717,647

(22) Filed: Mar. 4, 2010

(65) Prior Publication Data
US 2010/0260943 A1 Oct. 14, 2010

Related U.S. Application Data

(60) Provisional application No. 61/167,677, filed on Apr. 8, 2009.

(51) Int. Cl.
*H01L 21/425* (2006.01)
*G21K 1/00* (2006.01)

(52) U.S. Cl.
USPC .................. 438/527; 250/492.21; 250/492.3

(58) Field of Classification Search
USPC .............. 427/523, 526; 438/527; 250/492.21, 250/492.3
See application file for complete search history.

(56) References Cited

U.S. PATENT DOCUMENTS

| | | | |
|---|---|---|---|
| 4,183,797 A | 1/1980 | Kennedy et al. | |
| 4,701,251 A * | 10/1987 | Beardow | 204/298.25 |
| 4,981,408 A | 1/1991 | Hughes et al. | |
| 5,293,373 A * | 3/1994 | Toide et al. | 369/275.5 |
| 5,421,889 A | 6/1995 | Pollock et al. | |
| 5,500,296 A * | 3/1996 | Inoue et al. | 428/408 |
| 6,101,972 A * | 8/2000 | Bluck et al. | 118/723 MP |
| 6,203,862 B1 * | 3/2001 | Bluck et al. | 427/569 |
| 6,238,036 B1 * | 5/2001 | Ohtsuka | 347/37 |
| 6,838,227 B2 * | 1/2005 | Wang et al. | 430/320 |
| 7,030,395 B2 * | 4/2006 | Deak, IV | 250/492.21 |
| 7,276,712 B2 * | 10/2007 | Ferrara | 250/492.21 |
| 7,290,978 B2 | 11/2007 | Tran | |
| 7,727,866 B2 * | 6/2010 | Bateman et al. | 438/514 |
| 7,790,004 B2 * | 9/2010 | Seddon | 204/298.15 |
| 7,807,338 B2 * | 10/2010 | Takeda | 430/320 |
| 7,888,249 B2 * | 2/2011 | Bateman et al. | 438/527 |
| 8,096,744 B2 * | 1/2012 | Okada et al. | 414/217 |
| 2002/0157692 A1 | 10/2002 | Ishihara et al. | |
| 2003/0206794 A1 | 11/2003 | Konig et al. | |
| 2006/0260547 A1 * | 11/2006 | Zultzke et al. | 118/726 |
| 2008/0081485 A1 * | 4/2008 | Papanu et al. | 438/745 |
| 2008/0179284 A1 | 7/2008 | Hayes et al. | |
| 2009/0227094 A1 * | 9/2009 | Bateman et al. | 438/514 |
| 2010/0015356 A1 * | 1/2010 | Fukushima et al. | 427/569 |
| 2010/0098873 A1 * | 4/2010 | Verhaverbeke et al. | 427/526 |
| 2010/0197126 A1 * | 8/2010 | Bateman et al. | 438/527 |
| 2011/0006034 A1 * | 1/2011 | Hilkene et al. | 216/22 |

* cited by examiner

Primary Examiner — Evan Pert

(57) ABSTRACT

A method includes positioning at least one dual sided workpiece on an assembly in a process chamber to expose a first side of the at least one dual sided workpiece, treating the first side of the at least one dual sided workpiece, reorienting a portion of the assembly in the process chamber to expose a second side of the at least one dual sided workpiece, the second side opposing the first side, and treating the second side. A processing apparatus including a process chamber defining an enclosed volume and a dual sided workpiece assembly disposed in the enclosed volume is also provided.

10 Claims, 2 Drawing Sheets

DUAL SIDED WORKPIECE HANDLING

CROSS REFERENCE TO RELATED APPLICATIONS

This application claims the benefit of provisional patent application No. 61/167,677, filed Apr. 8, 2009, which is incorporated herein by reference.

FIELD

This disclosure relates to workpiece handling, and more particularly to dual sided workpiece handing.

BACKGROUND

Differing processing tools accept a workpiece and perform different processing steps depending on the type of tool. One type of a processing tool is an ion processing tool where a workpiece is treated with ions. An ion processing tool may include a plasma assisted doping (PLAD) tool or a beamline tool. A PLAD tool includes a process chamber where plasma is generated. One or more workpieces are positioned in the process chamber and biased to attract ions from the plasma. The ions may provide for precise material modification to the workpiece. The workpiece may include but not be limited to, magnetic disks, semiconductor wafers, flat panels, solar panels, and polymer substrates. A beamline tool includes an ion source and an extraction electrode assembly to extract a well defined ion beam from the ion source. One or more beamline components known in the art may control, modify, and direct the ion beam with desired characteristics towards a surface of a workpiece. The workpiece for the beamline tool may also include, but not be limited to, magnetic disks, semiconductor wafers, flat panels, solar panels, and polymer substrates. The ion beam may be distributed across a surface of the workpiece by ion beam movement, workpiece movement, or a combination of the two.

Many workpieces to be treated by such process tools are single sided workpieces in that there is only one side or surface of the workpiece subject to treatment. For example, the front surface of a conventional semiconductor wafer is treated with ions but the rear surface is not. However, some workpieces are dual sided workpieces that have front and opposing rear sides to be treated. For example, a magnetic disk used in a conventional hard disk drive may require ion treatment on both sides of the disk.

Conventional wafer handling equipment in an ion processing tool accepts a dual sided workpiece for processing and treats only a first side of the workpiece. If a second opposing side of the same workpiece also needs to be treated, it is removed from the ion processing tool which is typically under vacuum while processing. Once removed from the tool and the vacuum condition, the workpiece would then need to be reoriented, and then inserted back into the ion processing tool with its second opposing side now positioned for treatment. One drawback with this conventional equipment and method is the substantial time to perform the removal and reinsertion steps. This additional time negatively impacts throughput performance or the number of workpieces that can be processed over a given time period. Another drawback is that these removal and reinsertion steps necessarily involve workpiece handling operations which is an inherent factor in reliability of the entire processing operation.

Accordingly, there is a need in the art for improved dual sided workpiece handling that overcomes the above-described inadequacies and shortcomings.

SUMMARY

According to a first aspect of the disclosure a method is provided. The method includes positioning at least one dual sided workpiece on an assembly in a process chamber to expose a first side of the at least one dual sided workpiece, treating the first side of the at least one dual sided workpiece, reorienting a portion of the assembly in the process chamber to expose a second side of the at least one dual sided workpiece, the second side opposing the first side, and treating the second side.

According to another aspect of the disclosure, a processing apparatus is provided. The processing apparatus includes: a process chamber defining an enclosed volume; a dual sided workpiece assembly disposed in the enclosed volume, the dual sided workpiece assembly comprising a base portion and a flip portion coupled to the base portion, the flip portion having a support surface configured to support at least one dual sided workpiece, and wherein the flip portion is configured to rotate about a flipping axis; and a controller configured to control the dual sided workpiece assembly to expose a first side of the at least one dual sided workpiece to treatment in the process chamber and to expose a second side of the at least one dual sided workpiece to treatment by rotating the flip portion about the flipping axis, the second side opposing the first side.

The present disclosure will now be described in more detail with reference to exemplary embodiments as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
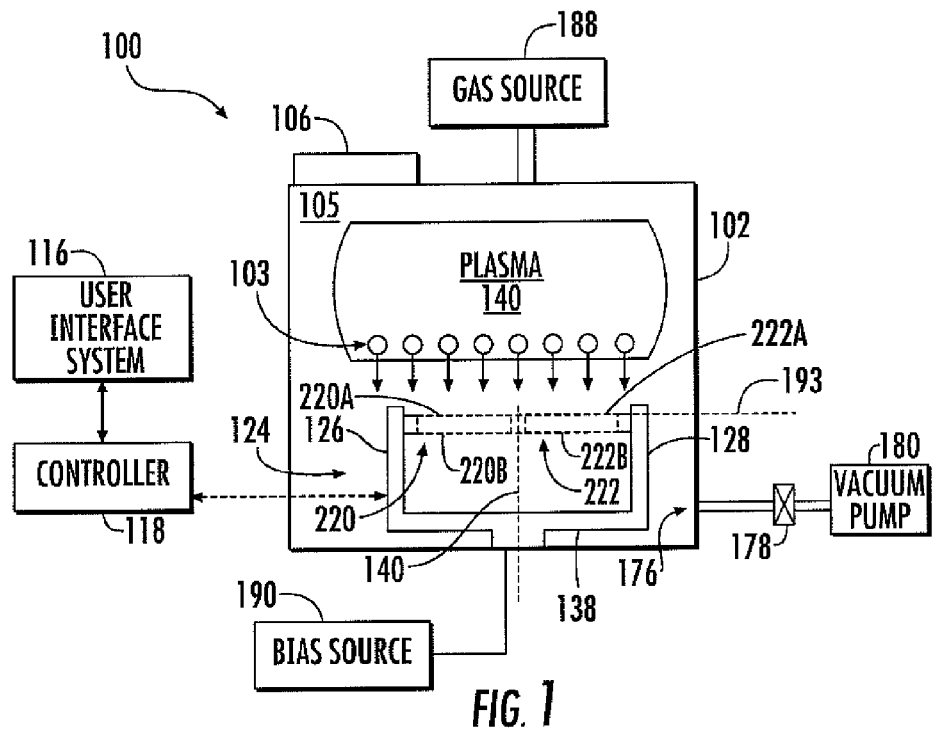
FIG. 1 is a block diagram of a processing apparatus having a dual sided workpiece handling assembly consistent with one embodiment of the disclosure.

FIG. 1 is a block diagram of a processing apparatus 100 illustrating in cross sectional view a dual sided workpiece handling assembly 124 consistent with one embodiment of the disclosure. Although the processing apparatus 100 is further described herein as a plasma doping apparatus, a dual sided workpiece assembly 124 consistent with the disclosure may also be disposed in the process chamber of other processing tools such as etch tools, deposition tools, and beam line ion implanters. The beamline ion implanter may include an ion source know in the art from which a well defined ion beam is extracted. One or more beamline components known in the art may control, modify, and direct the ion beam with desired characteristics towards a surface of a dual sided workpiece. The process chamber of the beamline ion implanter may also be referred to in the art as an end station. Furthermore, a plasma doping apparatus can perform many differing material modification processes using ions on a treated workpiece. One such process includes directing ions towards a magnetic disk workpiece for use in hard drives to alter the magnetic characteristics of desired regions of the disk. Another process includes directing ions towards a semiconductor wafer workpiece with sufficient energy to implant the ions into a semiconductor material.

Figure 2:
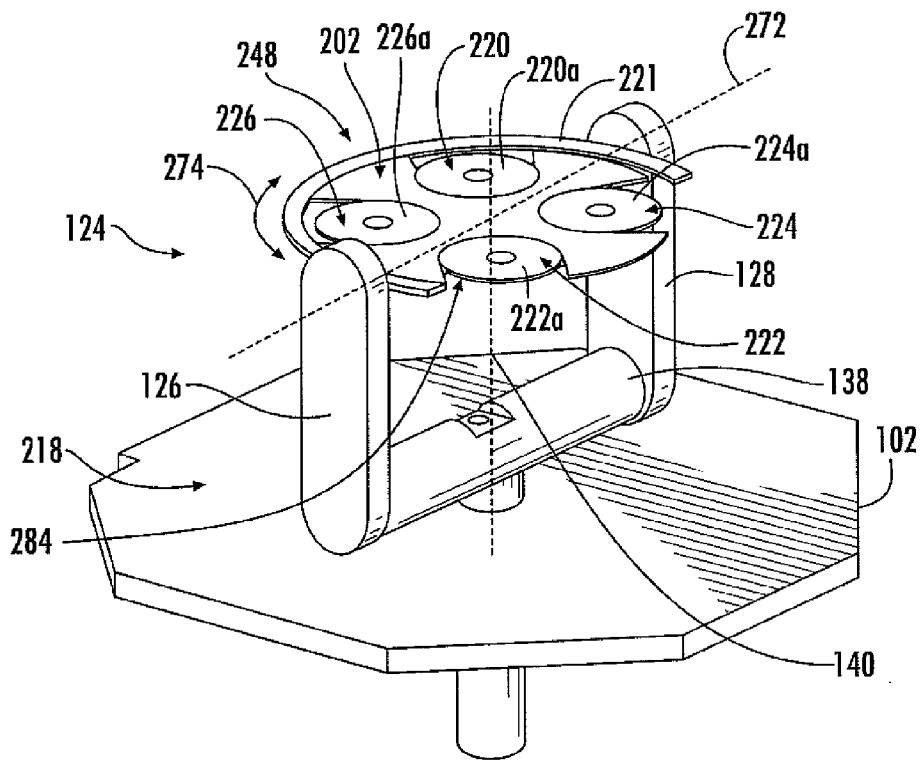
FIG. 2 is a perspective view of the dual sided workpiece handling assembly of FIG. 1.

The processing apparatus 100 of FIG. 1 is illustrated as a stand alone system, but alternatively may be part of a cluster tool including other processing apparatuses. FIG. 2 is a perspective view of the dual sided handling assembly 124 of FIG. 1. In general, the dual sided workpiece handling assembly 124 is configured to enable opposing sides of one or more dual sided workpieces to be treated in situ without removing the workpieces from the process chamber 102 between treatment of each side. For example, each workpiece 220, 222 shown in phantom in FIG. 1 may have a first side 220A, 222A and a second opposing side 220B, 222B. Ions 103 may be accelerated towards the first sides 220A, 222B during treatment of the same. A portion of the assembly 124 may then be reoriented to expose the second opposing sides 220B, 222B to the ions 103. The dual sided workpieces 220, 222 remain in the process chamber 102 during a time interval between the treating of the first sides 220A, 222A and second sides 220B, 222B.

The processing apparatus 100 may include a process chamber 102, a gas source 188, a vacuum pump 180, a plasma source 106, a bias source 190, a controller 118, a user interface system 116, and the dual sided workpiece handling assembly 124. The process chamber 102 defines an enclosed volume 105. A gas source 188 provides a gas to the enclosed volume 105 of the process chamber 102. A vacuum pump 180 evacuates the process chamber 102 through the exhaust port 176 to create a high vacuum condition within the process chamber. The vacuum pump 180 may include a turbo pump, and/or a mechanical pump. An exhaust valve 178 controls the exhaust conductance through the exhaust port 176.

The plasma source 106 is configured to generate the plasma 140 in the process chamber 102. The plasma source 106 may be any plasma source known to those in the art such as an inductively coupled plasma (ICP) source, a capacitively coupled plasma (CCP) source, a microwave (MW) source, a glow-discharge (GD) source, or a helicon source, or a combination thereof.

The bias source 190 provides a bias signal to the dual sided workpiece handling assembly 124 and each workpiece supported thereby. The bias source 190 may be a DC power supply to supply a DC bias signal or an RF power supply to supply an RF bias signal depending on the type of plasma source 106. In one embodiment, the DC bias signal is a pulsed DC bias signal with ON and OFF periods to accelerate ions 103 from the plasma 140 to the workpieces during the ON periods. Controlling the duty cycle and amplitude of such a pulsed DC bias signal can influence the dose and energy of the ions 103.

The controller 118 can be or include a general-purpose computer or network of general-purpose computers that may be programmed to perform desired input/output functions. The controller 118 also includes communication devices, data storage devices, and software. The user interface system 116 may include devices such as touch screens, keyboards, user pointing devices, displays, printers, etc. to allow a user to input commands and/or data and/or to monitor the processing apparatus 100 via the controller 118. The controller 118 may receive signals from the user interface system 116 and/or one or more components or sensors of the processing apparatus 100 and control various components of the apparatus 100. For clarity of illustration, the controller 118 is illustrating as communicating with only the dual sided workpiece assembly 124 to control the same. Those skilled in the art will recognize that the controller 118 may receive signals from all of the components of the processing apparatus 100 and control the same, e.g., control the bias source 190, the vacuum pump 180, the plasma source 106, etc., in response to differing conditions and instructions.

With reference to FIG. 2, the dual sided workpiece assembly 124 may be fixed to a portion of the process chamber 102 and generally include a base portion 218 and a flip portion 248. The base portion 212 supports the flip portion 248 and enables the flip portion 248 to flip 180° about a flipping axis 272 as indicated by arrow 274. The base portion 218 may include a support rod 138 coupled to a pair of opposing upstanding arms 126, 128. The arms 126, 128 may further support the flip portion 248 and have a length sufficient to permit the flip portion 248 to flip 180° about the flipping axis 272 without contacting other components such as the support rod 138. The base portion 218 may also be configured to allow for rotation of the flip portion 248 about a rotational axis 140 to facilitate alignment of the workpieces 220, 222, 224, 226 with other robots and openings (not illustrated). The rotational axis 140 may be orthogonal to a workpiece plane 193 defined by the carrier 202 that supports the workpieces 220, 222, 224, 226.

The flip portion 248 in the embodiment of FIG. 2 includes a carrier 202 having four pockets to accept four dual sided workpieces 220, 222, 224, 226. The pockets may also allow for good thermal contact of the workpieces 220, 222, 224, 226 to the carrier 202 for thermal control. The dual sided workpiece assembly 124 may also have passageways (not illustrated) for transporting cooling fluid of a cooling system there through for thermal control.

The workpieces 220, 222, 224, 226 are illustrated as magnetic disks for use in a conventional hard disk drive. Alternative embodiments may have only one pocket for one workpiece or any plurality of pockets. The carrier 202 may be supported and secured by a guide rail 221 having an opening and a slot to accept and secure the carrier 202. The guide rail 221 may have mechanical features such as protrusions and/or indents to further secure the carrier 202 once fully inserted into the opening of the guide rail 221. The guide rail 221 and carrier 202 may form part of a gimbal mechanism to facilitate the rotation of the carrier 202 about the flipping axis 272. The carrier 202 may be shaped similar to a conventional 300 millimeter (mm) diameter semiconductor wafer. That is, the carrier 202 may have a disk shape with about a 300 mm diameter so that existing wafer handling equipment designed to accommodate 300 mm semiconductor wafers can readily handle a similarly shaped carrier 202.

Figure 3:
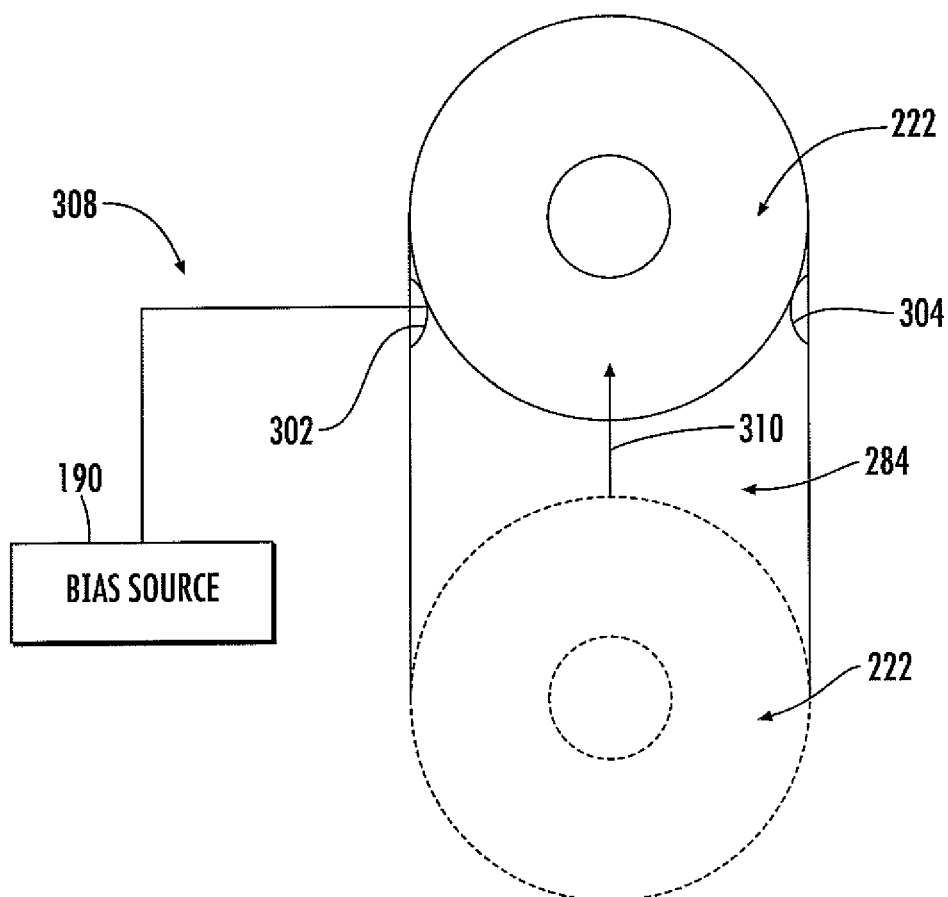
FIG. 3 is a plan view of a portion of the carrier of FIG. 2 in more detail.

Turning to FIG. 3, a plan view of one slot 284 of the carrier 202 of FIG. 2 is illustrated in more detail. The slot 284 has a pair biasing members such as the pair of springs 302, 304. The springs 302, 304 both secure the workpiece 222 within the slot 284 and also complete an electrical path 308 from the biasing source 190 to the workpiece 222. Hence, the springs 302, 304 advantageously serve a dual role. The workpiece 222 of FIG. 3 is shown in phantom as it enters the opening of the slot 284 and is urged in the direction of the arrow 310. The workpiece 222 is also shown in solid lines at its secured position fully within the recess of the slot 284 and further retained and supported by the outward bias of the pair of springs 302, 304.

In operation, four dual sided workpieces 220, 222, 224, 226 may be urged into respective slots of the carrier 202. The dual sided workpieces 220, 222, 224, 226 may be magnetic disks. As each workpiece is urged into a respective slot of the carrier 202 with sufficient force, a pair of springs 302, 304 may be compressed to enable the full insertion of the workpiece. For example, FIG. 3 illustrates the workpiece 220 in solid lines fully inserted into the slot 284. The springs 302, 304 are outwardly biased to serve a dual role of further securing the workpiece 222 in the slot 284 while also providing an electrical path 308 for a biasing signal from the bias source 190. Each slot of the carrier 202 may also have similar springs 302, 304. Associated wafer handling equipment and robots may transfer the carrier 202 with the workpieces 220, 222, 224, 226 fully engaged in respective slots to a secure position within the guide rail 221 of the flip mechanism 248. Such a carrier 202 can improve throughput as multiple workpieces 220, 222, 224, 226 can be loaded in batches rather than one at a time. Alternatively, a turntable having one or more machined pockets may be used in the flip portion 248 in lieu of the carrier 202. As opposed to the carrier 202, the turntable may be permanently fixed in the flip portion 248 of the assembly 124. The pockets of the turntable allow for retention of associated workpieces with sufficient electrical contact to receive a biasing signal from the bias source 190.

Once the carrier 202 is secured in the guide rail 221 and associated wafer handling equipment is withdrawn from the process chamber 102, the gas source 188 may supply an ionizable gas to the process chamber 102. Examples of an ionizable gas include, but are not limited to, $BF_3$, $BI_3$, $N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $CF_4$, $AsF_5$, $PF_3$, and $PF_5$. The plasma source 106 may generate the plasma 140 by exciting and ionizing the gas provided to the process chamber 102.

The dual sided workpiece handling assembly 124 may hold the workpieces 220, 222, 224, 226 to expose a first side 220A, 222A, 224A, 226A of each to the plasma 140. The bias source 190 may provide a bias signal to each workpiece 220, 222, 224, 226 to attract the ions 103 towards the first side 220A, 222A, 224A, 226A of the workpieces. When the workpieces 220, 222, 224, 226 are the illustrated magnetic disks for use in hard drives, the ions 103 alter the magnetic characteristics of desired regions of the disks. Once a first side of each workpiece 220, 222, 224, 226 is processed, the dual sided workpiece handling assembly 124 may reorient the workpieces in the process chamber 102 to expose a second opposite side of each workpeiece to the plasma 140. To reorient the workpieces, the controller 118 may instruct the dual sided workpiece handling assembly 124 to flip the carrier 202 by 180° about the flipping axis 272 thus allowing the second opposing side of the workpieces (e.g., sides 220B and 222B of workpieces 220, 222) to be treated by the ions 103. The assembly 124 may have one or more electromechanical actuators (not illustrated) to facilitate such flipping. During a time interval between treating the first side and second side of the workpieces, the workpieces 220, 222, 224, 226 remain in the process chamber 102.

Furthermore, the controller 118 may instruct the vacuum pump 180 and associated system to maintain a vacuum condition in the process chamber 102. This vacuum condition may be maintained during the treating of the first side 220A, 222A, 224A, 226A of the workpieces 220, 222, 224, 226 and the second opposing side of the workpieces, as well as the time interval between the treating of the first and second side.

Accordingly, there is provided a method that enables both sides of a dual sided workpiece to be treated in situ within a process chamber. The dual sided workpieces may therefore be processed quickly and reliably. The throughput of a processing apparatus such as an ion implanting apparatus may therefore be improved compared to a conventional apparatus that removes each workpiece from the process chamber, reorients the workpieces, and then reinserts the same with the opposing side positioned for treatment.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method comprising:
   positioning at least one dual sided workpiece on an assembly in a process chamber to expose a first side of the at least one dual sided workpiece;
   accelerating ions towards the first side of the at least one dual sided workpiece during a first time interval;
   flipping a portion of the assembly in the process chamber about a flipping axis to expose a second side of the at least one dual sided workpiece, the second side opposing the first side; and
   accelerating ions towards the second side during a second time interval different than the first time interval.

2. The method of claim 1, wherein the at least one dual sided workpiece remains in the process chamber during a time interval between the first time interval and the second time interval.

3. The method of claim 2, wherein the method further comprises pumping the process chamber to a vacuum condition and maintaining the vacuum condition during the first time interval, the second time interval, and the time interval between the first time interval and the second time interval.

4. The method of claim 1, wherein the accelerating ions are provided by generating a plasma in the process chamber, and biasing the at least one dual sided workpiece to accelerate ions in the plasma towards the first side and the second side.

5. The method of claim 4, wherein the at least one dual sided workpiece comprises a magnetic disk, and wherein the accelerating ions a retic characteristic of a region of the magnetic disk.

6. The method of claim 1, wherein the accelerating ions are provided by generating an ion beam and directing the ion beam having the ions towards the at least one dual sided workpiece.

7. The method of claim 1, wherein flipping the portion of the assembly comprises flipping the portion 180° about the flipping axis.

8. The method of claim 4, wherein the at least one dual sided workpiece comprises a plurality of dual sided magnetic disks, and the method further comprises:
   supporting the plurality of dual sided magnetic disks with a carrier, the carrier defining a workpiece plane, and rotating the carrier about a rotation axis orthogonal to the workpiece plane to position one of the plurality of magnetic disks in a desired position.

9. The method of claim 8, wherein the carrier has a disk shape having about a 300 millimeter diameter.

10. The method of claim 8, further comprising securing each of the plurality of dual sided magnetic disks to an associated slot of the carrier with a pair of biasing members, and biasing each of the plurality of dual sided magnetic disks via an electrical path including the pair of biasing members.

* * * * *

UNITED STATES PATENT AND TRADEMARK OFFICE
CERTIFICATE OF CORRECTION

PATENT NO. : 8,563,407 B2  Page 1 of 1
APPLICATION NO. : 12/717647
DATED : October 22, 2013
INVENTOR(S) : Richard J. Hertel et al.

It is certified that error appears in the above-identified patent and that said Letters Patent is hereby corrected as shown below:

In the Claims:
Column 6, Line 54, Claim 5, "a retic" should be changed to --alter a magnetic--

Signed and Sealed this
Fourth Day of February, 2014

Michelle K. Lee
*Deputy Director of the United States Patent and Trademark Office*